(12) United States Patent
Clara et al.

(10) Patent No.: US 11,489,536 B1
(45) Date of Patent: Nov. 1, 2022

(54) INPUT CIRCUITRY FOR AN ANALOG-TO-DIGITAL CONVERTER, RECEIVER, BASE STATION AND METHOD FOR OPERATING AN INPUT CIRCUITRY FOR AN ANALOG-TO-DIGITAL CONVERTER

(71) Applicant: Intel Corporation, Santa Clara, CA (US)

(72) Inventors: Martin Clara, Santa Clara, CA (US); Daniel Gruber, St. Andrae (AT); Giacomo Cascio, Villach (AT); Albert Molina, Novelda (ES)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/358,093

(22) Filed: Jun. 25, 2021

(51) Int. Cl.
*H03M 1/10* (2006.01)
*H04B 1/12* (2006.01)
*H04B 1/48* (2006.01)

(52) U.S. Cl.
CPC ............ *H03M 1/1014* (2013.01); *H04B 1/48* (2013.01)

(58) Field of Classification Search
CPC .......... H03M 1/001; H03M 1/06; H03M 1/08; H03M 1/10; H03M 1/1004; H03M 1/1009; H03M 1/1014; H04B 1/06; H04B 1/10; H04B 1/12; H04B 1/123; H04B 1/40; H04B 1/44; H04B 1/48
See application file for complete search history.

(56) References Cited

U.S. PATENT DOCUMENTS

| | | | | |
|---|---|---|---|---|
| 7,969,336 | B2* | 6/2011 | Yoshioka | H03M 1/1004 341/122 |
| 8,823,563 | B1 | 9/2014 | Ransun | |
| 8,928,507 | B2* | 1/2015 | Taluja | H04L 25/08 341/118 |
| 9,461,660 | B2* | 10/2016 | Muhammad | H03M 1/1255 |
| 10,715,203 | B2* | 7/2020 | Wang | H04B 1/123 |
| 2007/0152863 | A1 | 7/2007 | Lie et al. | |
| 2011/0037628 | A1 | 2/2011 | Petrovic | |
| 2013/0222162 | A1 | 8/2013 | Xiao et al. | |
| 2016/0352347 | A1 | 12/2016 | Fernando et al. | |
| 2018/0183455 | A1* | 6/2018 | Lee | H03M 1/1019 |

* cited by examiner

*Primary Examiner* — Quochien B Vuong
(74) *Attorney, Agent, or Firm* — 2SPL Patent Attorneys PartG mbB; Kieran O'Leary

(57) ABSTRACT

Input circuitry for an analog-to-digital converter (ADC) is provided. The input circuitry includes a calibration signal source configured to output a calibration signal for the ADC and an analog circuitry configured to receive and process an analog input signal for the ADC. The analog circuitry is further configured to generate a combined signal by combining the analog input signal and the calibration signal. The input circuitry further includes a buffer amplifier coupled to the analog circuitry and configured to supply a buffered signal to the ADC based on the combined signal. Further, the input circuitry includes neutralization circuitry configured to generate, based on the calibration signal, a neutralization signal for mitigating an unwanted signal component related to a limited reverse isolation of the analog circuitry. The neutralization circuitry is further configured to supply the neutralization signal to at least one of an input node and an intermediate node of the analog circuitry.

19 Claims, 11 Drawing Sheets

INPUT CIRCUITRY FOR AN ANALOG-TO-DIGITAL CONVERTER, RECEIVER, BASE STATION AND METHOD FOR OPERATING AN INPUT CIRCUITRY FOR AN ANALOG-TO-DIGITAL CONVERTER

FIELD

The present disclosure relates to analog-to-digital conversion. In particular, examples relate to an input circuitry for an analog-to-digital converter (ADC), a receiver comprising the input circuitry, a base station comprising the receiver, a mobile device comprising the receiver and a method for operating an input circuitry for an ADC.

BACKGROUND

ADCs need calibration for compensating static errors, such as mismatch between accuracy limiting circuit elements and nonlinearity of analog circuitry, as well as dynamic errors such as drifts over time or due to temperature variations. For the calibration of the ADC in the background, an analog calibration signal can be provided at the analog-front end of the ADC. The analog calibration signal can be superimposed onto an analog input signal received by the analog-front end. The superimposed signal can be converted to digital by the ADC and can be evaluated for analog imperfections by appropriate digital signal processing. However, a certain amount of the analog calibration signal may leak to the analog input port supplying the analog input signal for the ADC. This may violate the spectral emission mask for a neighboring system unwantedly receiving the leaked calibration signal.

Hence, there may be a desire for improved analog-to-digital conversion e.g. with applied background calibration.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
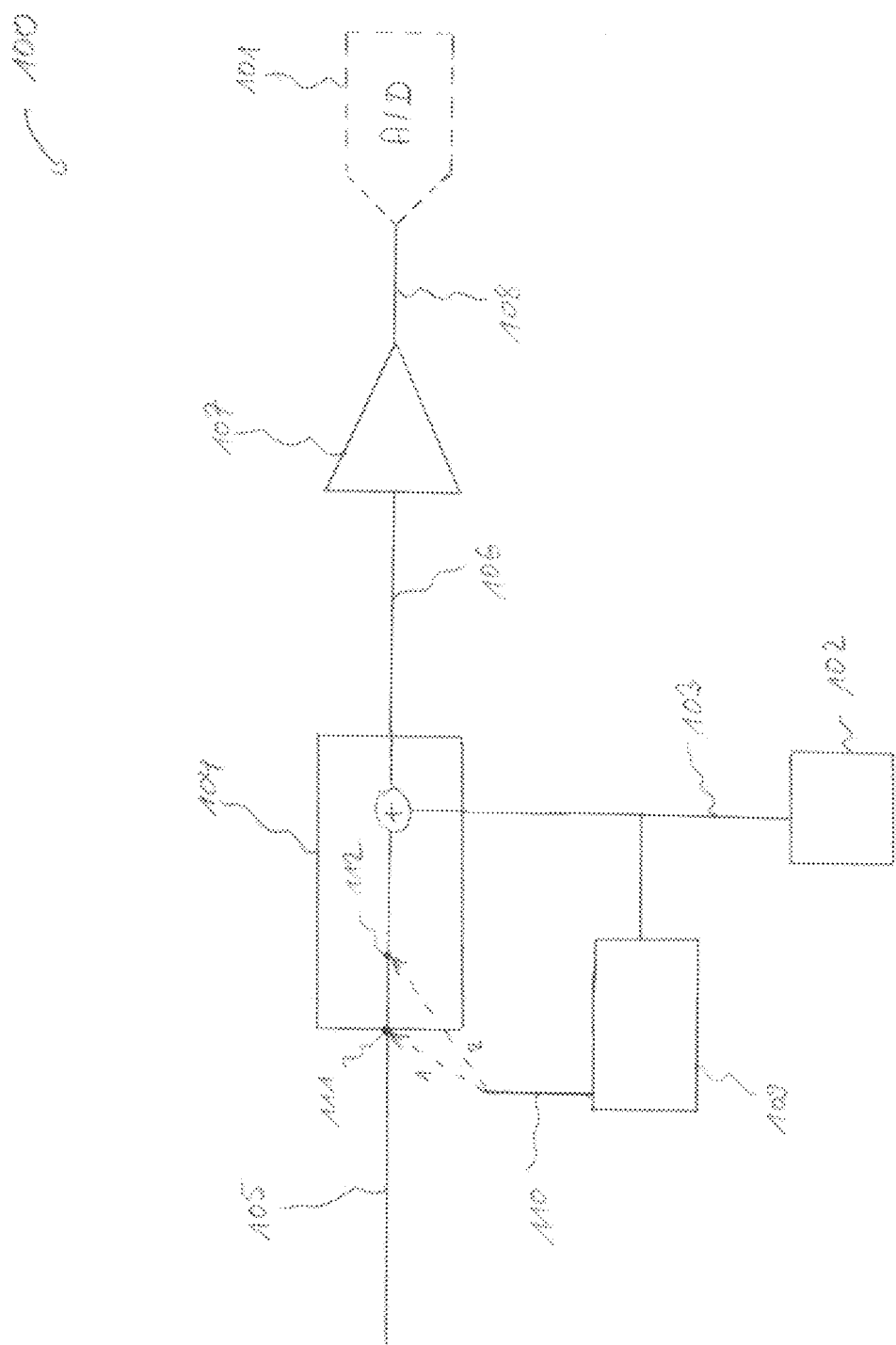
FIG. 1 illustrates an example of input circuitry for an ADC.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 shows an example of an input circuitry 100 for an ADC 101.

The input circuitry 100 comprises a calibration signal source 102 (or reference signal source) configured to output a calibration signal 103 (or reference signal) for the ADC 101. The input circuitry 100 further comprises analog circuitry 104 configured to receive and process an analog input signal 105 for the ADC 101. The analog circuitry 104 is further configured to generate a combined signal 106 by combining the analog input signal 105 and the calibration signal 103. Further, the input circuitry 100 comprises a buffer amplifier 107 coupled to the analog circuitry 104 and configured to supply a buffered signal 108 to the ADC 101 based on the combined signal 106. The input circuitry 100 further comprises a neutralization circuitry 109 configured to generate, based on the calibration signal 103, a neutralization signal 110 for mitigating an unwanted signal component related to a limited reverse isolation of the analog circuitry 104. Optionally, the unwanted signal component may be related to a limited reverse isolation of at least one of the analog circuitry 104, the buffer amplifier 107 and a reference injection network. The reference injection network is coupled between the calibration signal source 102 and a sub-circuit of the analog circuitry 104 combining the analog input signal 105 and the calibration signal 103. Further, the neutralization circuitry 109 is configured to supply the neutralization signal 110 to at least one of an input node 111 and an intermediate node 112 of the analog circuitry 104.

The analog input signal 105 (e.g. a radio frequency (RF) signal) is to be converted to a digital signal by the ADC 101. The calibration signal source 102 outputs the calibration signal 103 which is used to calibrate the ADC 101, e.g. during operation of the ADC (background calibration). The analog circuitry 104 may combine the received analog input signal 105 and the calibration signal 103 from the calibration signal source 102 to supply the combined signal 106 to for the buffer amplifier 107. An input of the buffer amplifier receives the combined signal 106 and supplies the buffered signal 108. The buffer amplifier 107 drives an input stage (e.g. sample-and-hold stage) of the ADC 101. Based on the buffered signal 108, the ADC 101 may output an improved digital value for the analog input signal 105 since errors in the ADC 101 may be reduced or compensated based on the evaluation of the added calibration signal 103, e.g. by dedicated digital signal processing and applying correction mechanism (e.g. by appropriately changing the behavior of the analog circuitry 104, or by appropriately correcting the digital output data of the ADC 101). The analog (front-end) circuitry 104 (together with the buffer amplifier 107 or a reference injection network for injecting the calibration signal 103 to a sub-circuit of the analog circuitry 104) may exhibit a limited (or finite) reverse isolation. Accordingly, part of the calibration signal 103 may leak back as unwanted signal component to the input of the analog circuitry 104 (and, hence, to any upstream circuitry (system) coupled to the input of the input circuitry 100) or to a system in the vicinity, partially or completely independent of the RF-signal chain the input circuitry 100 is a part of. The neutralization circuitry 109 may use the calibration signal 103 to generate the neutralization signal 110 to compensate (or at least reduce) the leaked signal component of the calibration signal 103. For compensation, the neutralization circuitry 109 supplies the neutralization signal 110 to the input node 111 of the analog circuitry 104 (in FIG. 1 indicated by dashed line denoted by "1"), the intermediate node 112 (or internal node) of the analog circuitry 104 (in FIG. 1 indicated by dashed line denoted by "2") or both. Accordingly, leakage of unwanted signal components of the calibration signal 103 to the input (or a system coupled to the input) of the input circuitry may be compensated. As a consequence, leakage of the unwanted signal component related to the limited reverse isolation of the analog circuitry 104 to upstream circuitry coupled to the input of the input circuitry 100 may be avoided or reduced to an acceptable level, i.e. in compliance with the (system-specific) spectral emission mask applicable to the input node 111 (e.g. chip input) of the input circuitry 100.

The neutralization circuitry 109 receives the calibration signal 103 as an input and generates the neutralization signal 110 as an output. The neutralization circuitry 109 may comprise one ore more couplings paths (or neutralization paths) between the input and the output of the neutralization circuitry 109. The one ore more couplings paths may comprise one or more impedance elements, such as resistors, capacitors and/or inductors, contributing to the transfer function $T_N(j\omega)$ of the neutralization circuitry 109. The transfer function of the neutralization circuitry 109 may be adjusted or made adjustable (e.g. via controllable switches in the coupling paths) according to a reverse isolation transfer function $T_{ISO}(j\omega)$ of the analog circuitry.

For example, the transfer function used by the neutralization circuitry 109 to generate the neutralization signal 110 is (e.g. approximately) the negative of the reverse isolation transfer function of the analog circuitry 104. The reverse isolation transfer function of the analog circuitry 104 may determine the content (e.g. with respect to amplitude, frequency or phase or a combination thereof) of the unwanted signal component leaking to the input of the analog circuitry 104 or the input of the input circuitry 100. With the transfer function of the neutralization path being the negative of the reverse isolation transfer function of the analog circuitry a neutralization signal can be generated which can properly compensate or mitigate the unwanted signal component. For example, (maximum or optimal) compensation of the unwanted signal by the provided neutralization signal may be based on:

$$T_N(j\omega) \sim -T_{ISO}(j\omega).$$

The transfer function $T_N(j\omega)$ of the neutralization circuitry 109 as well as the reverse isolation transfer function $T_{ISO}(j\omega)$ of the analog circuitry 104 may be complex transfer functions. Accordingly, gain and phase of the neutralization signal 110 may be frequency dependent.

For example, one may look for $T_N(s)=-T_{ISO}(s)=\exp(+/-j\pi)\ T_{ISO}(s)$ for neutralizing, by addition, over a specific frequency range of interest, $T_{ISO}(s)$ with the transfer function $T_N(s)$, such that $T_{ISO}(s)+T_N(s)=0$. The (neutralization) transfer function target may be actually the (complex) negative of the reverse isolation transfer function which may mean same magnitude, but inverse phase ($abs(T_N(s))=abs(T_{ISO}(s))$, $phase(T_N(s))=180+/-phase(T_{ISO}(s))$) with $s=j2\pi f$.

According to another example, it may be enough to reduce the unwanted signal component up to a certain level (or to compensate the unwanted signal component partly). For example, the transfer function of the neutralization circuitry may be related to the inverse isolation transfer function of the analog circuitry such that a signal reduction is achieved up to −10 dB, up to −20 dB or up to −30 dB depending on how much the (system-specific) spectral emission mask defined at the input node 111 (chip or package RX-input) would be violated when the neutralization circuitry 109 is not present. A reduction of signal components up to a certain level may be desired for easier implementation or operation of the neutralization circuitry.

The neutralization circuitry 109 may supply (e.g. inject) the neutralization signal 110 to the input node 111 or the intermediate node 112 (or both) of the analog circuitry 104. By this, unwanted signal components of the calibration signal 103 and the neutralization signal 110 can be superimposed in the analog domain. The unwanted signal components can be neutralized (or compensated, cancelled or at least reduced) such that a system coupled to the input of the circuitry 100 (or even to the input node 111, intermediate node 112 or both of the analog circuitry 104 or any other fully or partially independent system in the vicinity, e.g. off-chip or on-chip, of the input circuitry 100) might not suffer from the leaked signal. Unwanted signal components may be determined or measured by a spectral analysis e.g. at the input node 111 of the analog circuitry. Based on the measurement (or e.g. on simulation) the neutralization circuitry 109 can be implemented.

The analog circuitry 104 receives the analog input signal 105, processes the analog input signal 105 and generates the combined signal 106 for the ADC 101. For this, the analog circuitry 104 may comprise several sub-circuits. For example, the analog circuitry 104 comprises a first sub-circuit and a second sub-circuit. The first sub-circuit is upstream of the second subcircuit. In other words, an output of the first sub-circuit is coupled to the input of the second sub-circuit (or the first sub-circuit is preceding the second sub-circuit). The first sub-circuit is configured to receive and process the analog input signal 105. The input node 111 and the intermediate node 112 may be part of the first sub-circuit. The first sub-circuit may comprise components to inject the neutralization signal 110 to the input node 111, the intermediate node 112 or both of the analog circuitry 104. The first sub-circuit may comprise components such that the neutralization signal 110 and the unwanted signal components can be combined (e.g. summed up or subtracted from each other). The first sub-circuit may optionally comprise further components for processing such as transferring or attenuating the analog input signal 105.

The calibration signal source 102 (e.g. a signal generator) generates the calibration signal 103 useable by the second sub-circuit of the analog circuitry 104 and by the neutralization circuitry 109. In relation to the ADC full-scale, the calibration signal 103 may be small and sufficient enough for calibrating the ADC 101 and mitigating or compensating the unwanted signal component by the neutralization circuitry 109. For example, if calibration with the calibration signal 103 generated by the calibration signal source 102 happens during traffic, i.e. in background, the calibration signal 103 may be small enough to not significantly reduce the dynamic range of the ADC 101 (since it is subtracted from or filtered out of the ADC output data stream). For example, the amplitude of the combined signal 108 may be less or equal $\frac{1}{8}=-16$ dB relative to the ADC full-scale. This may be equivalent to a loss of 1 dB of dynamic range, i.e. the traffic signal might not be larger than −1 dBFS to be able to safely avoid clipping in the ADC 101. Principally, higher calibration signals during background calibration may be possible, e.g. if losing more dynamic range for the wanted traffic signal is acceptable. This may be only valid for background calibration. During foreground calibration without traffic signal the calibration signal 103 could be made as large as the ADC full-scale. Feasibility may depend on the allowable calibration signal leakage (spectral emission mask) during a foreground calibration period without traffic signal (e.g. at startup).

The buffer amplifier 107 may enable to generate a stable, buffered signal 108 based on the combined signal 106. The buffering operation of the buffer amplifier 107 may provide an impedance transformation between the ADC 101 and the analog circuitry 104 preceding the buffer amplifier 107. The buffer amplifier 107 may comprise various circuitry for providing the impedance transformation. For example, the buffer amplifier may comprise one or more transistors (e.g. in a source-follower configuration) for performing the impedance transformation.

The ADC digitizes (i.e. samples and quantizes) the buffered version of the combined signal 106 being the sum of the analog input signal 105 and the calibration signal 103 injected into the analog circuitry 104. The ADC 101 may be any conventional ADC such as a successive-approximation ADC, a flash ADC, pipelined ADC etc. As indicated by the dashed lines, the ADC 101 may be an optional component of the input circuitry 100. The input circuitry 100 may be implementable without the ADC 101 or the input circuitry 100 may be implemented such that the input circuitry 100 is connectable to the (input) of the ADC 101.

The input circuitry 100 may enable to convert single-ended or differential input signals 105. The input circuitry 100 may counter a leakage due to the calibration signal 103 used for background-calibration of an ADC 101. The proposed technique may enable to reduce unwanted signal components of the calibration signal, e.g. without the need for a significant overdesign (or reverse isolation, or power consumption) of the analog circuitry 104 or the buffer amplifier 107. According to the proposed technique, an additional buffer amplifier (placed between circuitry providing the input signal 105 and the input node 111 for increasing the reverse isolation of the analog circuitry) might not be needed. Hence, the proposed input circuitry 100 might not need extra power or silicon area for neutralizing leaked signals in an ADC system using background calibration. The neutralization circuitry 109 may use the same calibration signal 103 as it is used for calibrating the ADC 101. The input circuitry 100 might not need an extra signal (in addition to the calibration signal 103) since generation or adjustment of a proper neutralization signal 110 can be performed by the (e.g. impedance) components in the neutralization circuitry 109.

Although not explicitly illustrated in FIG. 1, the input circuitry 100 may comprise additional or optional circuitry (components). For example, the input circuitry 100 may comprise filters, attenuators, switch circuits, impedance elements or couplings paths. Some exemplary apparatuses showing further details of the proposed technique will be described in the following with reference to FIGS. 2 to 11. In the following, the input circuitry may be described in conjunction with an ADC. It is to be understood that the ADC may be an optional component of the proposed input circuitry.

Figure 2:
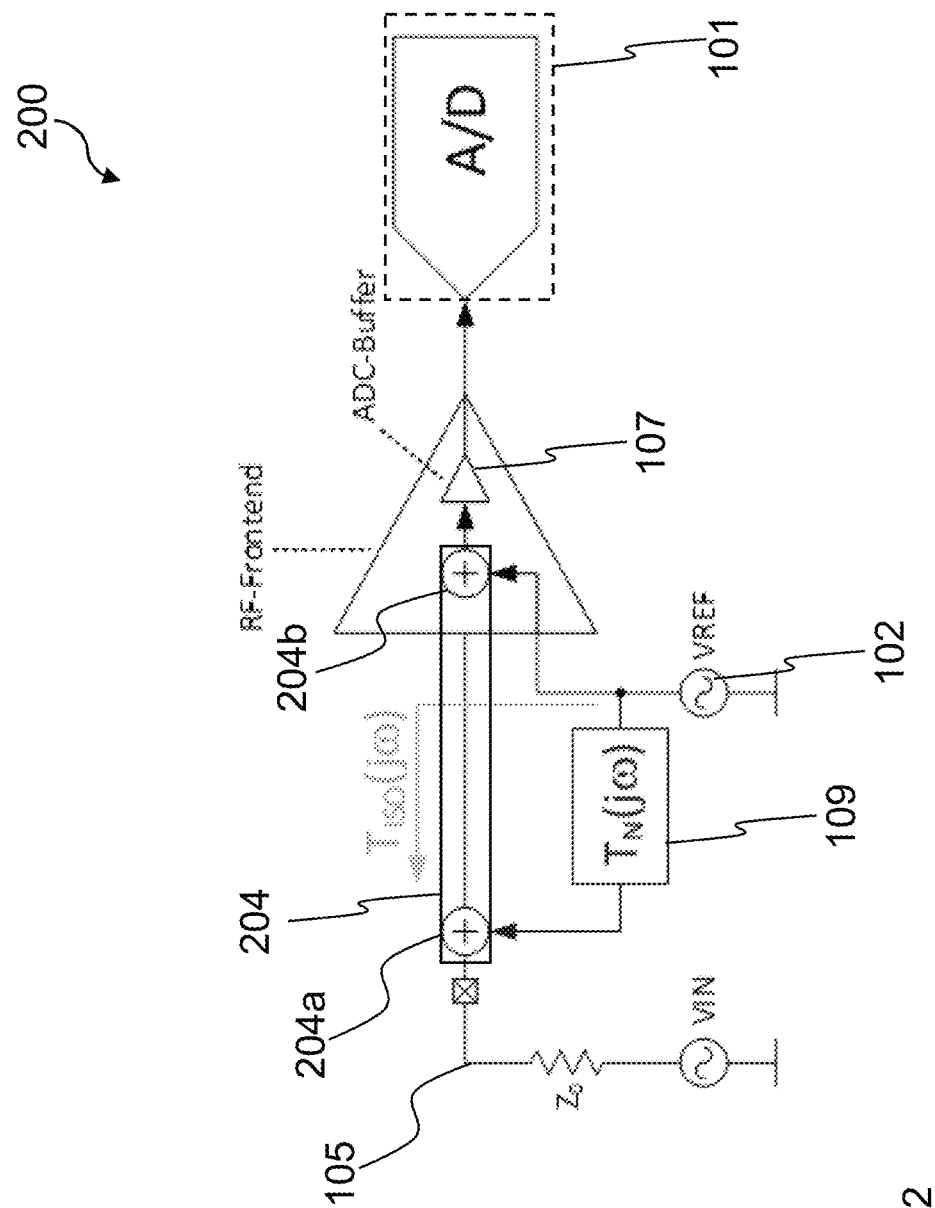
FIG. 2 illustrates another example of input circuitry for an ADC.

FIG. 2 shows another example of an input circuitry 200 for the ADC 101. The implementation of input circuitry 200 may be similar to the implementation of the input circuitry 100 described in connection with FIG. 1. The input circuitry 200 comprises an analog circuitry 204. The analog circuitry 204 comprises a first sub-circuit 204a and a second sub-circuit 204b. The first sub-circuit 204a is upstream of the second sub-circuit 204b. In other words, the output of the first sub-circuit 204a is coupled to the input of the second sub-circuit 204b. The first subcircuit 204a receives and processes (e.g. transfers or attenuates) the analog input signal 105 and e.g. supplies a processed signal. The second sub-circuit 204b generates the combined signal based on the processed signal (being based on the analog input signal 105) and the calibration signal 103.

The first sub-circuit 204a may comprise an input node, an intermediate node or both coupling the neutralization signal 110 from the neutralization circuitry 109 to a leaked calibration signal from the calibration signal source 102. By this, the neutralization signal and the unwanted signal component of the calibration signal can be combined in the analog domain.

The second sub-circuit 204b may comprise a common node coupling the calibration signal from the calibration signal source 102 and the processed signal (being based on the analog input signal 105). By this, the calibration signal and the processed signal can be combined (e.g. added) in the analog domain. As indicated in FIG. 2, the second sub-circuit 204b of the analog circuitry 204 may be a part of an RF-frontend circuit comprising the buffer amplifier 107.

The neutralization circuitry 109 may provide an extra analog neutralization path with transfer function $T_N(j\omega)$. The neutralization circuitry 109 is coupled between the calibration signal source 102 and the first sub-circuit 204a (e.g. the input node, the intermediate node or both). Generally, the neutralization circuitry may provide the neutralization signal to an analog input port of the input circuitry 200 (e.g. receiver input).

As indicated by $T_{ISO}(j\omega)$, the reverse isolation transfer function of the analog circuitry 104 may be dependent on the frequency $\omega$. Accordingly, the transfer function of the neutralization circuitry $T_N(j\omega)$ may be dependent on the frequency. As outlined above, the neutralization circuitry 109 may be implemented such that the condition $T_N(j\omega)=-T_{ISO}(j\omega)$ is approximately (or adequately) fulfilled over a range of frequencies consistent with the (possible) spectral locations of the calibration signal. By this, a cancellation (or at least reduction) of the leaked calibration signal to the first sub-circuit 204a can be accomplished.

More details and aspects of the input circuitry 200 are explained in connection with the proposed technique or one or more examples described above (e.g. FIG. 1) or below (FIGS. 3 to 11). The input circuitry 200 may comprise one or more additional optional features corresponding to one or more aspects of the proposed technique or one or more examples described above or below.

In the following, further examples of input circuitries are discussed in conjunction with FIGS. 3 to 8 and with respect to a differential implementation of the input circuitry. To those skilled in the art it is to be understood that the proposed techniques can be also implemented with single-ended signals.

Figure 3:
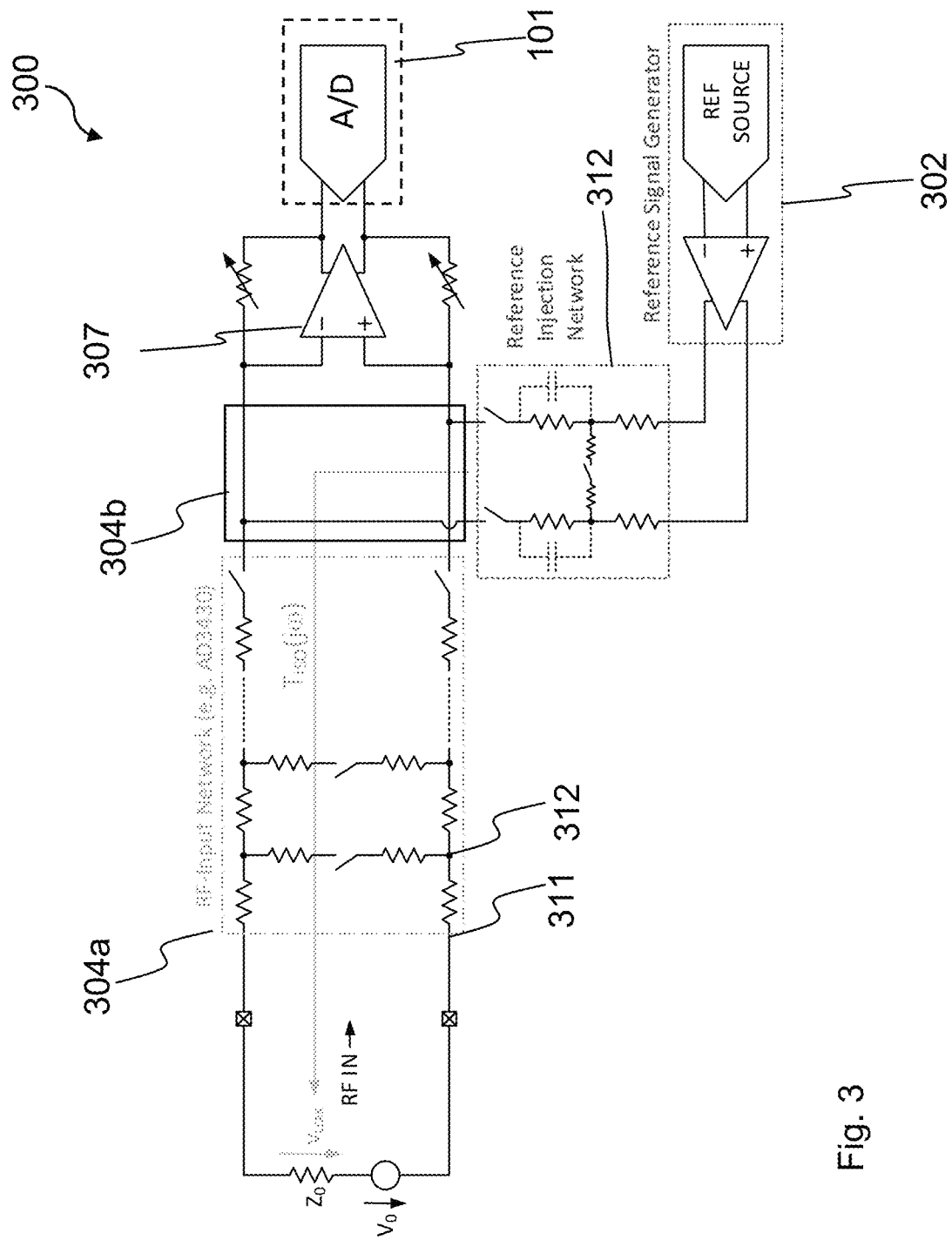
FIG. 3 illustrates another example of input circuitry for an ADC.

FIG. 3 shows another example of a (part of an) input circuitry 300 for the ADC 101. The implementation of the (part of the) input circuitry 300 may be similar to the implementation of the (part of the) input circuitry 100, 200 described in connection with FIGS. 1 to 2. The input circuitry 300 comprises a calibration signal source 302 (e.g. reference signal generator), analog circuitry (comprising a first sub-circuit 304a and a second sub-circuit 304b) and a buffer amplifier 307 each being similar to the respective components as described above and each being implemented for processing differential signals.

As exemplarily shown, the first sub-circuit 304a (e.g. RF-input network) of the analog circuitry is an attenuator circuit. The attenuator circuit may attenuate a power of the input signal to a proper level such that the linearity of the buffer amplifier 307 may be improved. For example, the first sub-circuit 304a comprises a plurality of resistors and shunt paths (between the respective paths for processing the differential signal). The first sub-circuit 304a may further comprise switch circuits which may be controlled to selectively decouple respective paths from each other, e.g. to adjust attenuation properties of the first sub-circuit 304a. The components of the first sub-circuit 304a (e.g. in conjunction with the behavior of the buffer amplifier 307 and its feedback elements) may determine the reverse isolation transfer function of the analog circuitry, e.g. with respect to an amplitude, phase or frequency (or a combination thereof) of a signal leaking to the input of the analog circuitry.

The first sub-circuit 304a comprises input nodes (e.g. input node 311) receiving a respective signal from the differential signal pair. Components of the first sub-circuit 304a, e.g. the resistors and switches, may be connected via intermediate nodes (e.g. intermediate node 312) of the first sub-circuit 304a. As it will be described below in conjunction with FIG. 6, input nodes and intermediate nodes may be used for injecting the neutralization signal to the analog circuitry.

As illustrated in FIG. 3, the input circuitry 300 further comprises a reference injection network 312 (or calibration path). The reference injection network 312 may be an optional component and is coupled between the calibration signal source 302 and the second sub-circuit 304b. Since the buffer amplifier 307 may have a certain degree of variability (gain programming), also the reference injection network 312 may need a similar degree of variability in order to keep the level of the injected calibration signal approximately constant at the ADC output. This may be accomplished by providing switches in the reference injection network 312, e.g. by providing a shunt path for attenuation similar to the first sub-circuit 304a. Frequency shaping to accomplish a certain forward transfer function for the calibration signal path may be accomplished by including frequency dependent elements like capacitors, inductors, coupled inductors in the reference injection network 312. For additional flexibility these can also be connected via switches.

FIG. 3 shows an example for a differential implementation of RF front-end with generic calibration signal injection and shows a possible implementation of the receiver RF front-end with calibration signal injection into the virtual ground nodes of the buffer amplifier 307.

More details and aspects of the (part of the) input circuitry 300 are explained in connection with the proposed technique or one or more examples described above (e.g. FIGS. 1, 2) or below (FIGS. 4 to 11). The input circuitry 300 may comprise one or more additional optional features corresponding to one or more aspects of the proposed technique or one or more examples described above or below.

Figure 4:
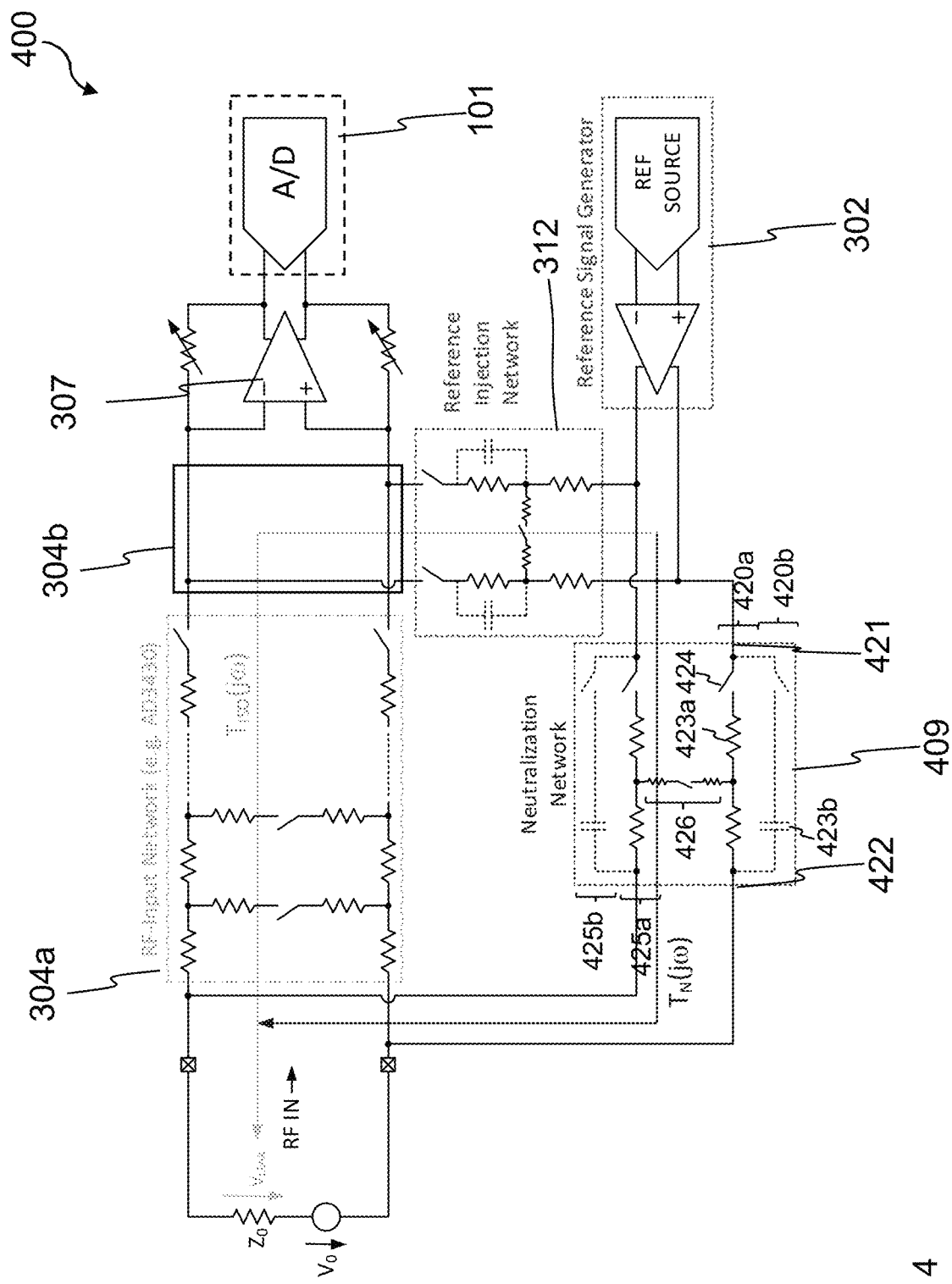
FIG. 4 illustrates another example of input circuitry for an ADC.

FIG. 4 shows another example of an input circuitry 400 for the ADC 101. The implementation of the input circuitry 400 may be similar to the implementation of the (part of) input circuitry 100, 200, 300 described in connection with FIGS. 1 to 3. The input circuitry 400 comprises a neutralization circuitry 409 (referred by neutralization network) coupled between the calibration signal source 302 and the input nodes of first sub-circuit 304a.

The neutralization circuitry 409 comprises at least one coupling path coupled between an input node 421 of the neutralization circuitry 409 and an output node 422 of the neutralization circuitry 409. The input node 421 of the neutralization circuitry 409 is configured to receive the calibration signal. The output node 422 of the neutralization circuitry 409 is configured to output the neutralization signal. According to the example in FIG. 4, the neutralization circuitry 409 comprises two coupling paths (e.g. 420a, 420b) for each respective calibration signal of the differential calibration signal pair. The at least one coupling path comprises an impedance element configured to generate the neutralization signal based on the calibration signal using a complex transfer function (e.g. $T_N(j\omega)$). As exemplarily shown in FIG. 4, the impedance element of the coupling path 420a comprises two resistors (among them e.g. resistor 423a) and the impedance element of the coupling path 420 comprises one capacitor 423b. According to another example, the impedance element may comprise at least one resistor, at least one capacitor or at least one inductor or a combination thereof. The impedance elements may determine the transfer function of the neutralization circuitry 409. For example, the amplitude, phase or spectral location (or a combination thereof) of the neutralization signal generated by the neutralization circuitry 409 may be determined by the types and or number of impedance elements, coupling paths or both. The type of impedance elements and coupling paths may be determined by the type and number of resistors, capacitors and inductors. Since capacitors and inductors comprises frequency dependent impedances, they might be used for realizing a frequency dependent transfer function of the neutralization circuitry 409.

As exemplarily shown in FIG. 4, the at least one coupling path comprises a switch circuit (e.g. switch 424) configured to selectively decouple, based on a control signal received from circuitry external to the neutralization circuitry 409, the impedance element (e.g. 423a) from the input node 421 of the neutralization circuitry 409. According to another example, a switch circuit may be configured to selectively decouple (or couple), based on the control signal received from the circuitry external to the neutralization circuitry 409, the impedance element from the output node 422 of the neutralization circuitry 409. Selectively decoupling (or coupling) the impedance element may be desired to adjust or control the transfer function (and hence the neutralization signal) of the neutralization circuitry 409 to compensate the leaked calibration signal more sufficiently e.g. by adjusting the amplitude, phase, frequency of the neutralization signal. For example, the switch circuit may be activated or deactivated according to an operation (e.g. indicated by the states of the switches) of the first sub-circuit 304*a* and optionally the reference injection network 312.

As exemplarily shown in FIG. 4, the neutralization circuitry 409 comprises at least one other coupling path coupled between another input node of the neutralization circuitry 409 and another output node of the neutralization circuitry 409. The neutralization circuitry 409 comprises two other coupling paths 425*a* (corresponding to coupling path 420*a*) and 425*b* (corresponding to coupling path 420*b*). The other input node of the neutralization circuitry 409 is configured to receive another calibration signal from the calibration signal source 302. The calibration signal and the other calibration signal form a differential calibration signal pair for the analog-to-digital converter 101. The other output node of the neutralization circuitry 409 is configured to output another neutralization signal to at least one of another input node and another intermediate node of the analog circuitry. The at least one other coupling path 425*a*, 425*b* comprises another impedance element configured to generate the other neutralization signal based on the other calibration signal using another other complex transfer function. Each of the other coupling paths 425*a*, 425*b* may be for the respective coupling paths 420*a*, 420*b* such that a differential neutralization signal pair can be provided based on the differential calibration signal pair received from the calibration signal source 302. The other coupling path (e.g. 420*a*) may be similar to (e.g. with respect to type, amount of resistors, capacitors, inductors, switches) the respective coupling path (e.g. 425*a*) such that a proper differential neutralization signal pair can be provided for mitigating the leaked differential calibration signal.

As exemplarily illustrated in FIG. 4, the neutralization circuitry 409 further comprises a shunt path 426 coupled between the at least one coupling path 420*a* and the at least one other coupling path 425*a*. The shunt path 426 comprises a switch circuit configured to selectively decouple (or couple), based on a control signal received from circuitry external to the neutralization circuitry 409, the at least one coupling path 420*a* from the at least one other coupling path 425*a*. Selectively decoupling (or coupling) the at least one coupling path 420*a* may be desired to adjust the transfer function (and hence the neutralization signal) of the neutralization circuitry to compensate the leaked calibration signal to a greater extent e.g. by adjusting the amplitude, phase, frequency of the neutralization signal. For example, the switch circuit may be activated or deactivated according to an operation (e.g. indicated by the states of the switches in the shunt paths) of the first sub-circuit 304*a* and optionally the reference injection network 312.

FIG. 4 shows an example for the differential implementation of the RF front-end of FIG. 3 with differential neutralization path. Switches in combination with resistors and frequency dependent elements (e.g. capacitors, inductors, coupled inductors) can be added to achieve the required amount of variability and tunability for the neutralization path, e.g. to be able to follow the changes in reverse isolation by the different settings of the first sub-circuit (e.g. RF input attenuator). With frequency dependent elements in the neutralization path (e.g. capacitors, inductors, coupled inductors) a frequency dependent leakage transfer function $T_{ISO}(j\omega)$, which in the example shown in FIG. 3 may depend on (the open loop gain of) the buffer amplifier 307 (and the input and feedback network), can be compensated. Parts of the neutralization circuitry 409 can be made switchable for increased flexibility.

More details and aspects of the input circuitry 400 are explained in connection with the proposed technique or one or more examples described above (e.g. FIGS. 1 to 3) or below (FIGS. 5 to 11). The input circuitry 400 may comprise one or more additional optional features corresponding to one or more aspects of the proposed technique or one or more examples described above or below.

Figure 5:
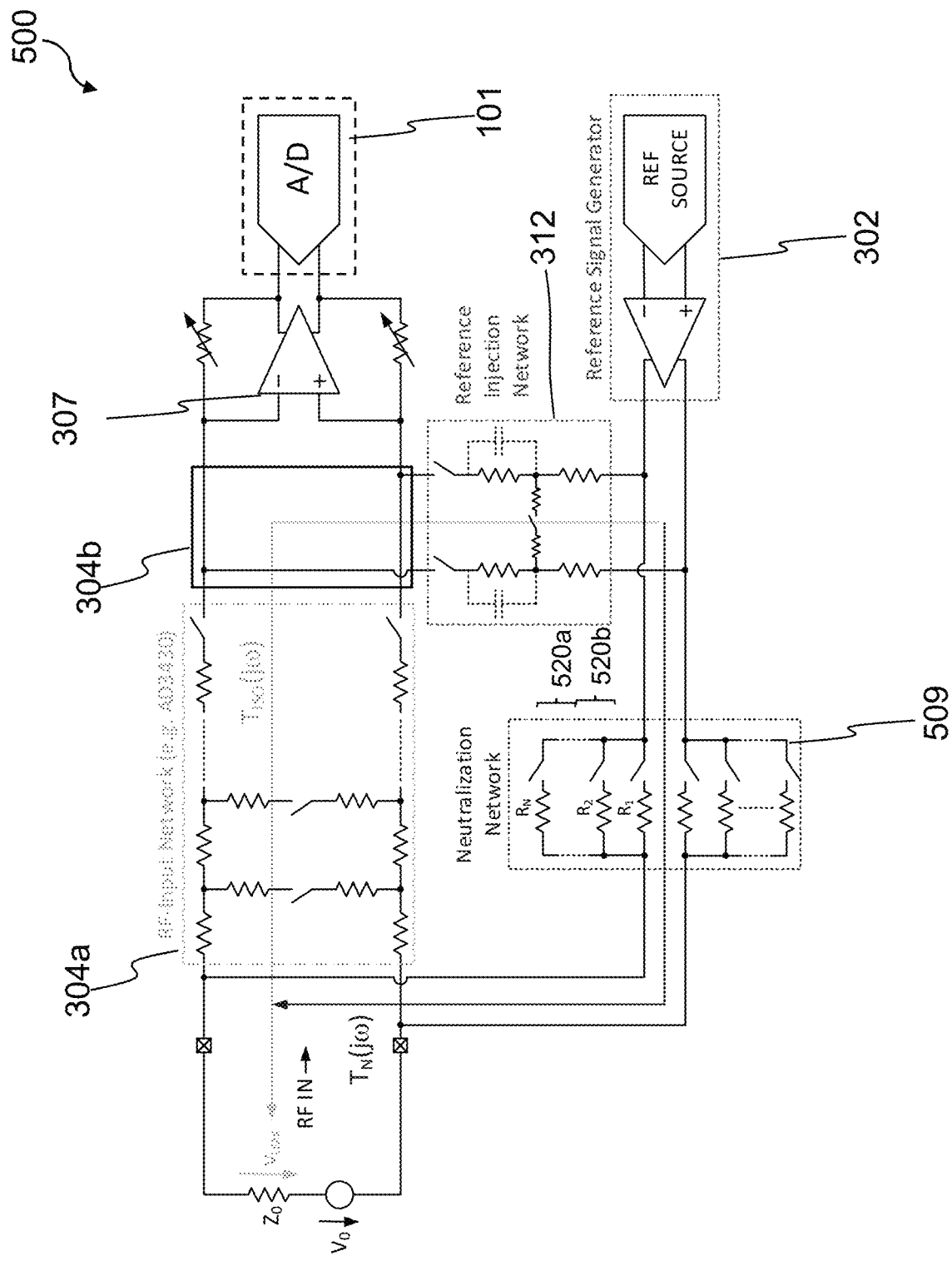
FIG. 5 illustrates another example of input circuitry for an ADC.

FIG. 5 shows another example of an input circuitry 500 for the ADC 101. The implementation of the input circuitry 500 may be similar to the implementation of the (part of the) input circuitries 100, 200, 300 400 described in connection with FIGS. 1 to 4.

The input circuitry 500 comprises a neutralization circuitry 509. The neutralization circuitry 509 comprises a plurality of coupling paths (e.g. coupling paths 520*a*, 520*b* etc.) coupled in parallel between the input node of the neutralization circuitry 509 and the output node of the neutralization circuitry 509. Each of the plurality of coupling paths comprises a respective impedance element configured to generate a respective contribution to the neutralization signal based on the calibration signal using a respective complex transfer function. Compared to the neutralization circuitries described above, the neutralization circuitry 509 may have a less complex architecture based on a simple parallel connection of resistors. In a more basic implementation, the neutralization circuitry may only comprise one resistor in a single coupling path (e.g. in a single-ended implementation) or one resistor for each of two coupling paths (e.g. in a differential implementation).

FIG. 5 shows an example of a differential RF front-end with analog calibration signal injection and resistive neutralization circuitry 509. FIG. 5 shows an example of a minimalistic implementation of the neutralization circuitry 509 by a (differential) switchable resistor, at a minimum one pair of resistors for each coupling path. In the example switches are added to have the possibility to disengage the neutralization circuitry 509. With more resistors and switches the "gain" of the neutralization transfer function $T_N(j\omega)$ can be programmed, including complete disengagement with all switches open. The switches can be arranged either on the side of the calibration signal source 302, or on the side of the first sub-circuit 304*a* (either on the input node or the intermediate node inside the first sub-circuit 304*a*). The former may be better in terms of electrostatic discharge (ESD) protection, e.g. if the switches are implemented as metal-oxide-semiconductor field-effect transistor (MOSFET) switches.

More details and aspects of the input circuitry 500 are explained in connection with the proposed technique or one or more examples described above (e.g. FIGS. 1 to 4) or below (FIGS. 6 to 11). The input circuitry 500 may comprise one or more additional optional features corresponding to one or more aspects of the proposed technique or one or more examples described above or below.

With a more complex first sub-circuit, e.g. comprising additional intermediate nodes (or internal nodes), a better cancellation or neutralization may be achievable (depending on the setting of the first sub-circuit) if e.g. one output node of the neutralization circuitry is coupled to one of the intermediate nodes of the first sub-circuit (e.g. rather than direct connection of all output nodes of the neutralization circuitry to the input nodes of the first sub-circuit). Similarly, in a differential implementation one pair of output nodes of the neutralization circuitry may be coupled to one pair of the intermediate nodes of the first sub-circuit.

Figure 6:
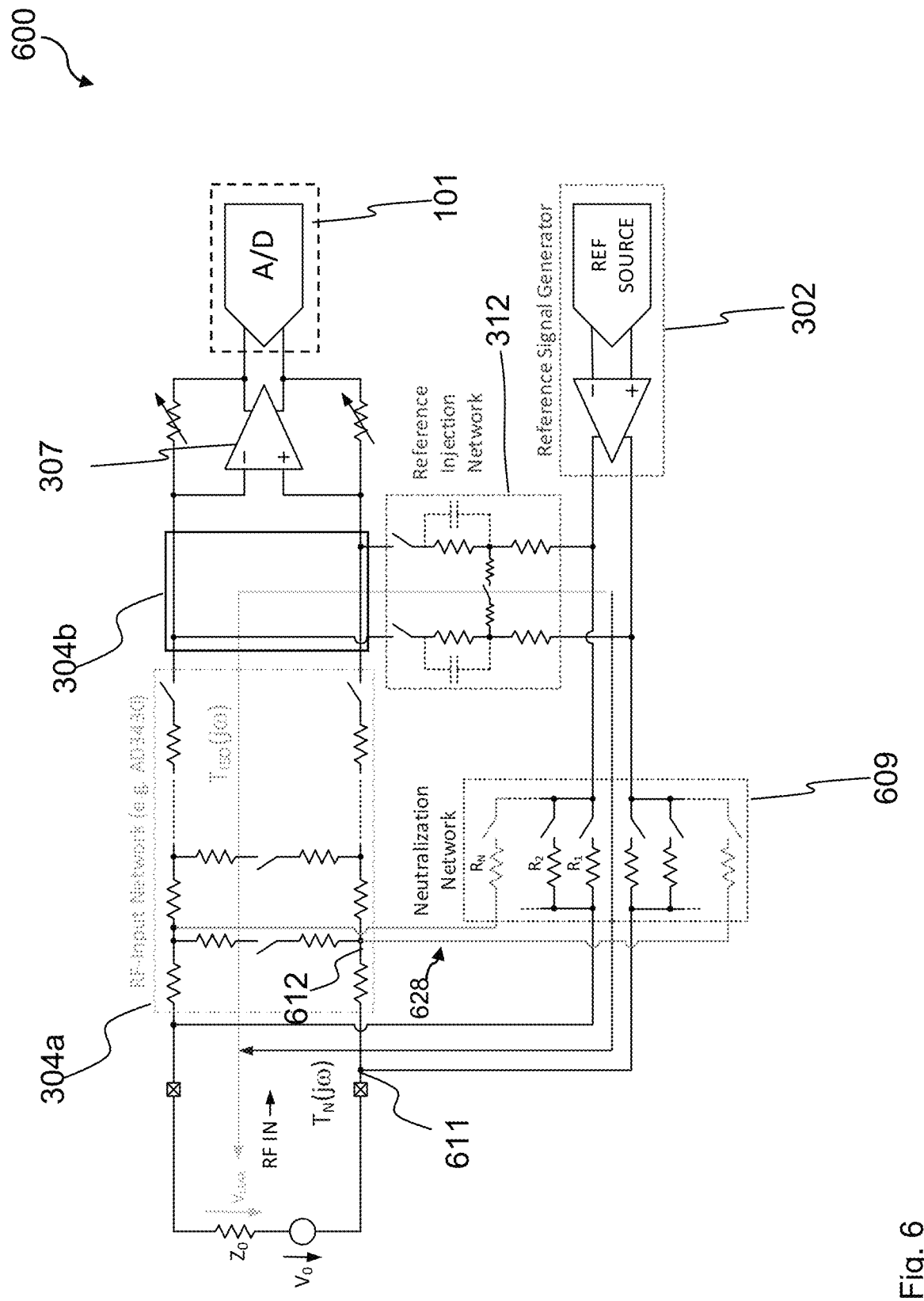
FIG. 6 illustrates another example of input circuitry for an ADC.

FIG. 6 shows another example of an input circuitry 600 for the ADC 101. The implementation of input circuitry 600 may be similar to the implementation of the (part of the) input circuitry 100, 200, 300, 400, 500 described in connection with FIGS. 1 to 5. As shown in FIG. 6, the neutralization circuitry 609 further comprises at least one further coupling path 628 coupled between the input node of the neutralization circuitry 609 and another output node of the neutralization circuitry 609. The output node of the neutralization circuitry 609 is coupled to the input node 611 of the analog circuitry. The other output node of the neutralization circuitry 609 is coupled to the intermediate node 612 of the analog circuitry. The at least one further coupling path 628 comprises a further impedance element (e.g. RN) configured to generate a further neutralization signal based on the calibration signal using a further complex transfer function. By the proposed implementation exemplarily given in FIG. 6, the leaked calibration signal could be easier or better mitigated by the neutralization signal (e.g. additionally) being supplied to an internal area of the first sub-circuit 304a.

FIG. 6 may show an extension of the neutralization circuitry 509 of FIG. 5 comprising at least one programmable or switchable (e.g. resistive) coupling path connected to an intermediate node 612 of the first sub-circuit 304a. According to another example, the single resistors in FIG. 5 and FIG. 6 can be alternatively or optionally be replaced or extended by a more complex network consisting of resistors, capacitors, inductors, coupled inductors or a combination thereof, e.g. to give the neutralization transfer function (filter) $T_N(j\omega)$ a specific spectral shape to better approximate the (ideal) neutralization condition as exemplarily stated above.

More details and aspects of the input circuitry 600 are explained in connection with the proposed technique or one or more examples described above (e.g. FIGS. 1 to 5) or below (FIGS. 7 to 11). The input circuitry 600 may comprise one or more additional optional features corresponding to one or more aspects of the proposed technique or one or more examples described above or below.

In the RF-frontend shown in FIG. 3 with the calibration signal injection connecting to the virtual ground node of the buffer amplifier 307, it may be expected that the isolation transfer function $T_{ISO}(j\omega)$ has a zero at a dominant pole $\omega_1$ of the open-loop transfer function of the buffer amplifier 307. For frequencies $\omega > \omega_1$ the isolation may therefore drop linearly with frequency (e.g. 20 dB/decade). To counteract such a frequency dependency in the isolation transfer function, the neutralization circuitry can include a similar frequency dependent element.

Figure 7:
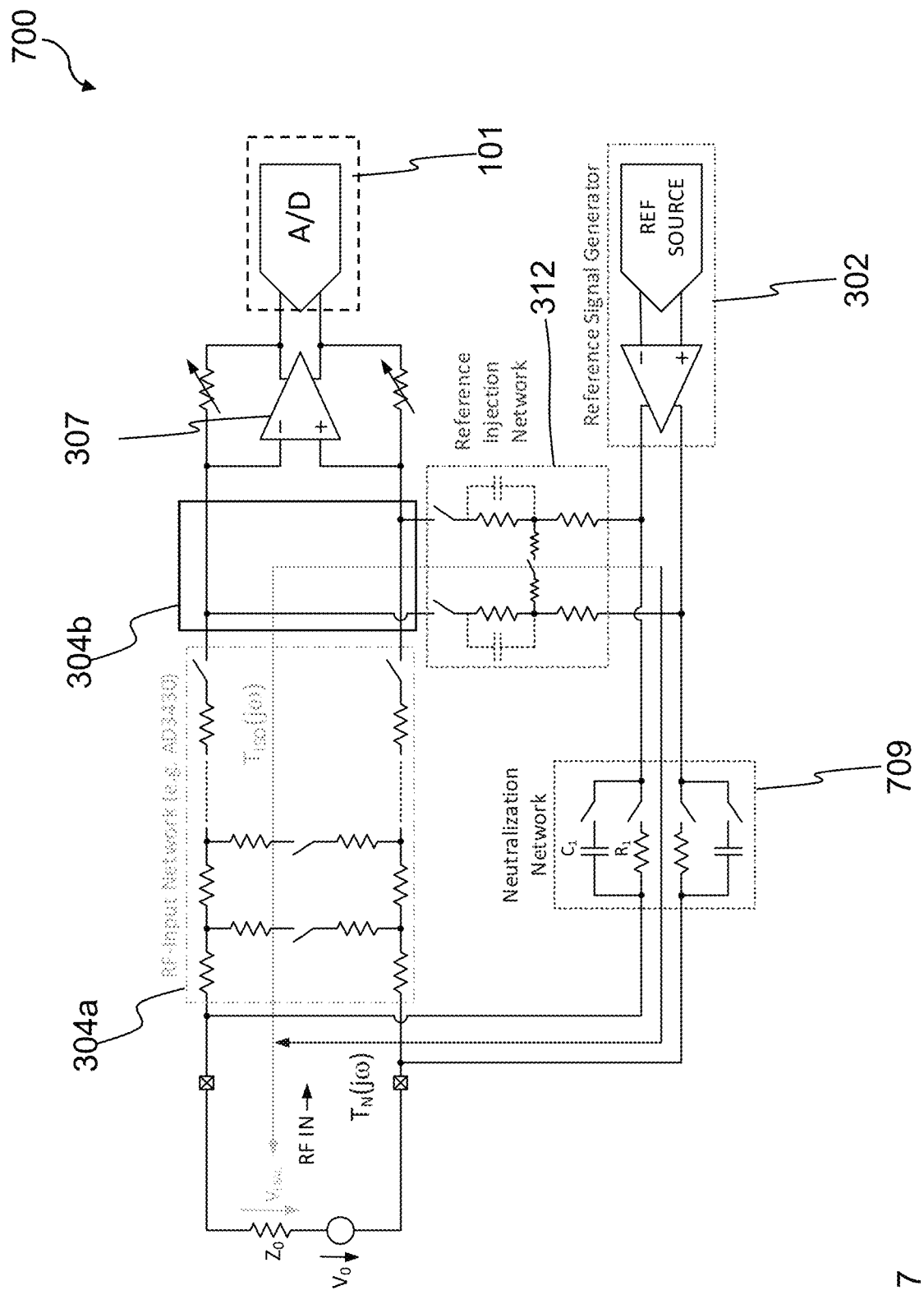
FIG. 7 illustrates another example of input circuitry for an ADC.

A basic example of an input circuitry comprising frequency dependent elements is given in FIG. 7. It shows an example of a differential RF front-end with resistive and capacitive elements in the coupling paths. Therein, the neutralization circuitry 709 comprises at least one capacitor in parallel to the one resistor in the coupling path. For higher flexibility additional capacitors with switches can be added. Alternatively or optionally the neutralization circuitry 709 may comprise further frequency dependent elements such as further capacitors or inductors (coupled in parallel or in series) to realize a more complex frequency dependent transfer function.

More details and aspects of the input circuitry 700 are explained in connection with the proposed technique or one or more examples described above (e.g. FIGS. 1 to 6) or below (FIGS. 8 to 11). The input circuitry 700 may comprise one or more additional optional features corresponding to one or more aspects of the proposed technique or one or more examples described above or below.

The high-pass character of the isolation transfer function might not extend to infinite frequencies but may include at least one pole $\omega_2$ such that for $\omega > \omega_2$ the isolation transfer function will become constant. At very high frequencies higher-order poles $\omega_n$ may finally cause the isolation transfer function to drop accordingly. While it may be unlikely that any reasonable system of interest will extend its usable bandwidth beyond $\omega_2$, a suitable neutralization circuitry that approximates this "zero followed by pole" behavior of the transfer function may be according to the example shown in FIG. 8. Besides adding programmability with either multiple such networks with switches in parallel, or just by adding multiple capacitors with switches to tune the location of the transmission zero in $T_N(j\omega)$, the networks of FIG. 7 and FIG. 8 can be combined with or be part of the ones shown in FIG. 4 to FIG. 6. For very small capacitors, a more appropriate tuning arrangement may be possible by using a T-network.

Figure 8:
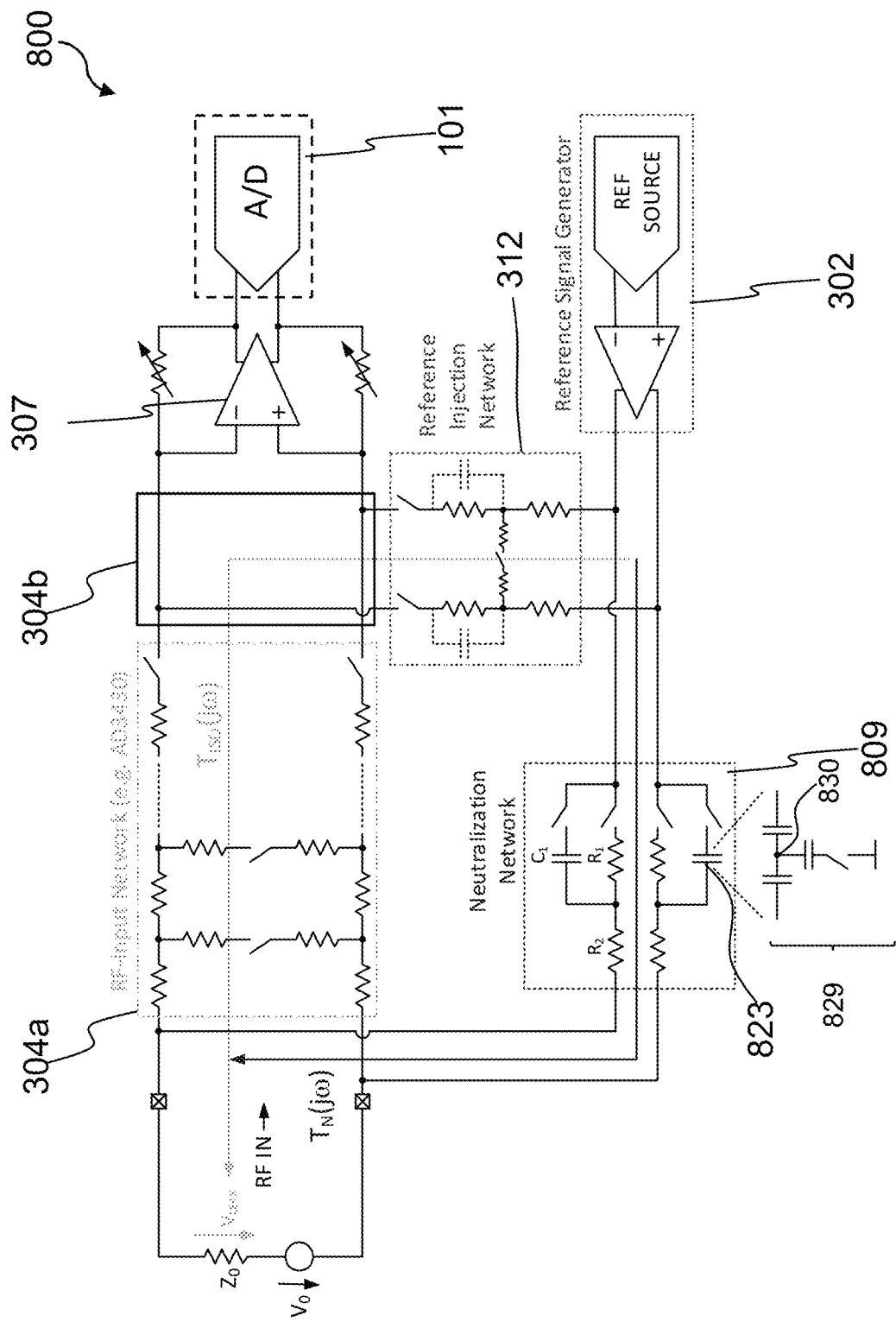
FIG. 8 illustrates another example of input circuitry for an ADC.

FIG. 8 shows example of an input circuitry 800 for the ADC 101 comprising a neutralization circuitry 809 with a T-network 829. The implementation of the input circuitry 800 may be similar to the implementation of the (part of the) input circuitry 100, 200, 300, 400, 500, 600, 700 described in connection with FIGS. 1 to 7. The impedance element (e.g. capacitive impedance element 823) comprises at least three capacitors each connected to a common node 830 to form the T-network 829. A first capacitor of the at least three capacitors is coupled between the input node or an intermediate node (e.g. internal node after a first resistor) of the neutralization circuitry 809 and the common node 830, a second capacitor of the at least three capacitors is coupled between the common node 830 and the output node or another intermediate node (e.g. another internal node) of the neutralization circuitry 809. A third capacitor of the at least three capacitors is coupled between the common node 830 and a ground node via a switch. A T-network may be suitable if an implementation of small capacitances is desired, e.g. to realize a transfer function of the neutralization circuitry more accurately (fine-tuning).

Figure 9:
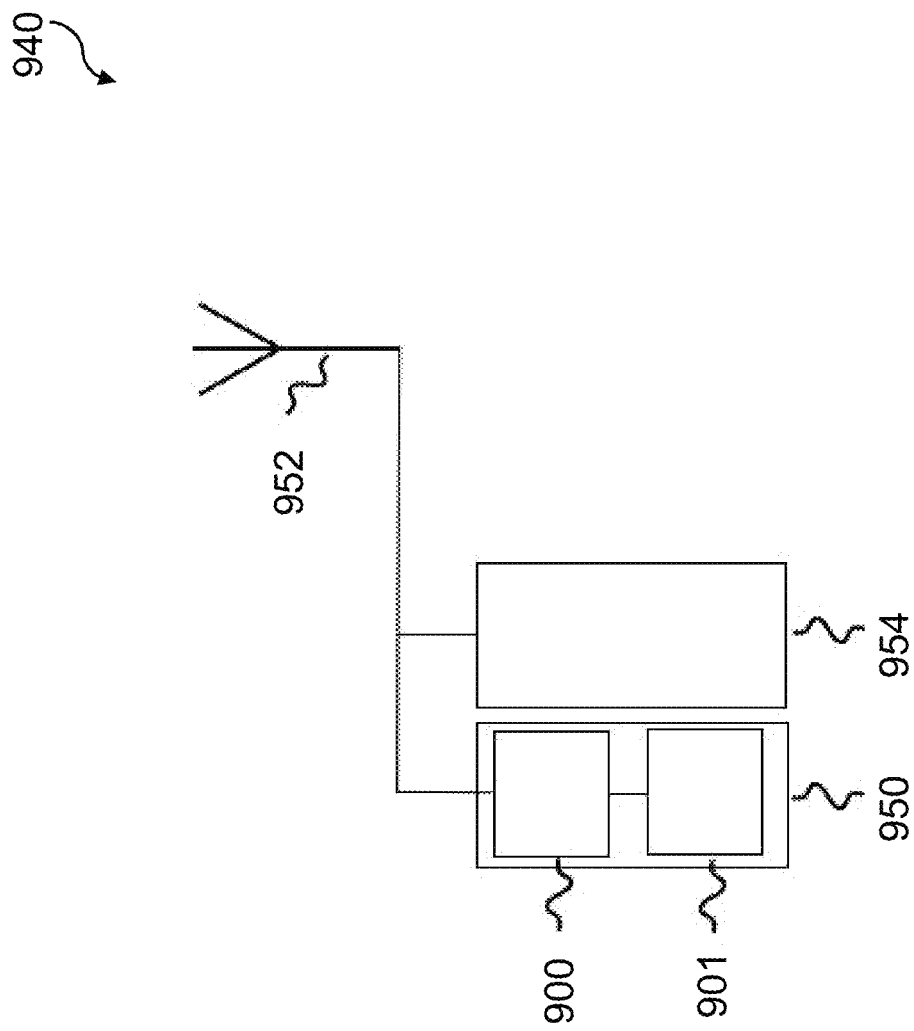
FIG. 9 illustrates an example of a base station.
Figure 10:
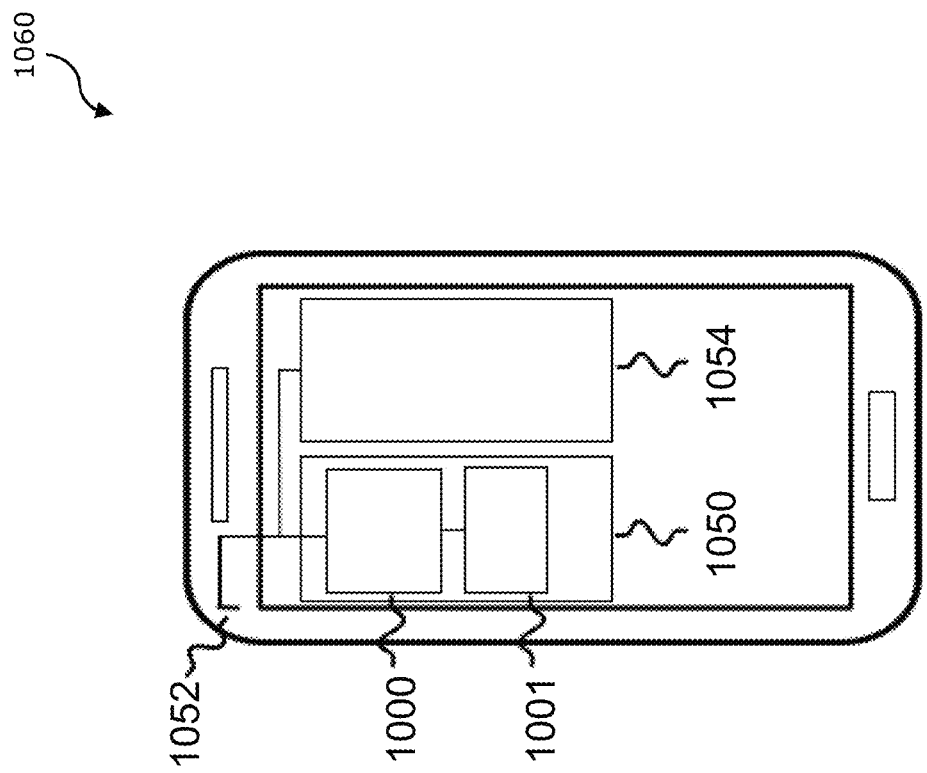
FIG. 10 illustrates an example of a mobile device.
Figure 11:
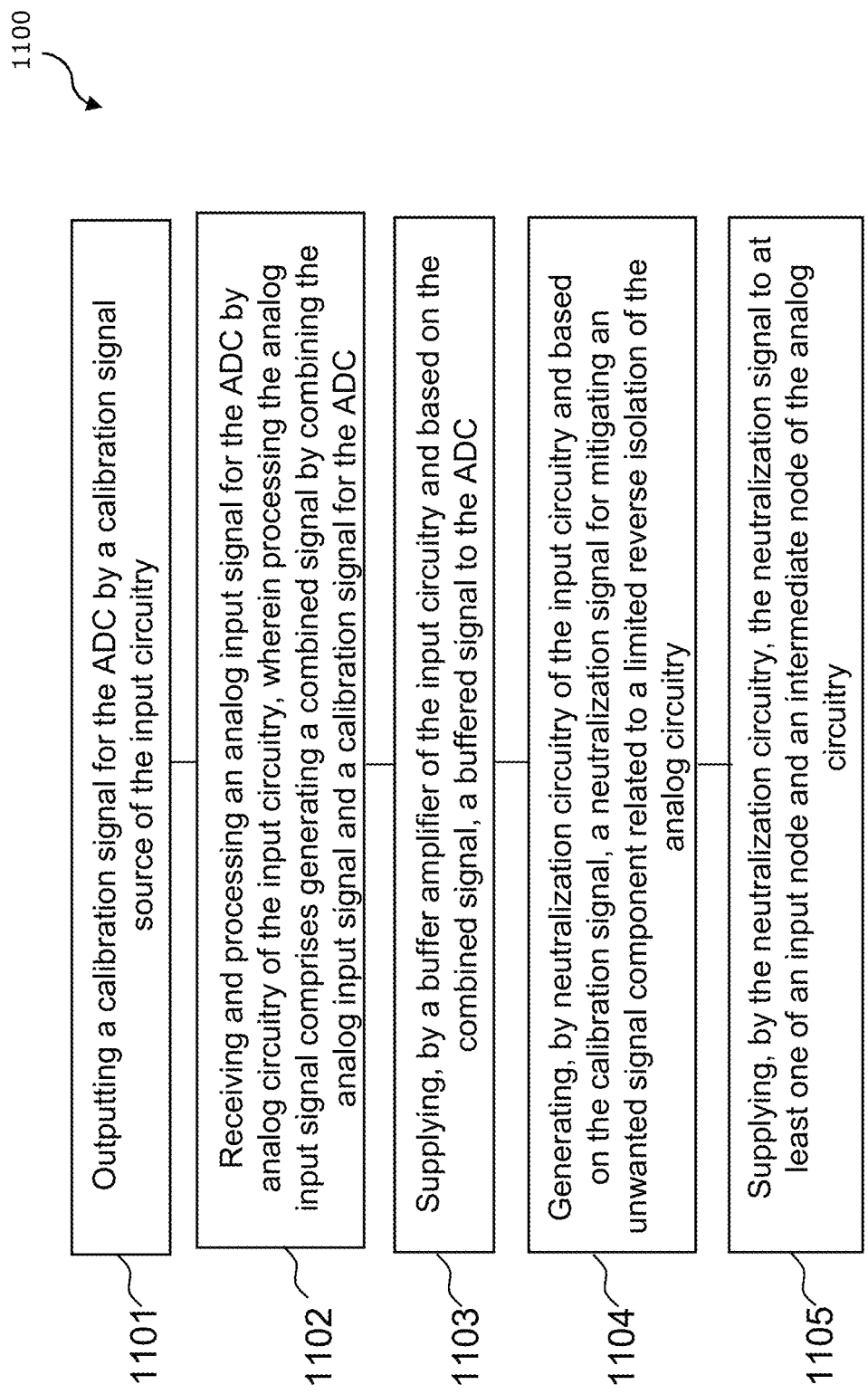
FIG. 11 illustrates a flowchart of an example of a method for operating an input circuitry for an ADC.

More details and aspects of the input circuitry 800 are explained in connection with the proposed technique or one or more examples described above (e.g. FIGS. 1 to 7) or below (FIGS. 9 to 11). The input circuitry 800 may comprise one or more additional optional features corresponding to one or more aspects of the proposed technique or one or more examples described above or below.

An example of an implementation using analog-digital conversion according to one or more aspects of the input circuitry described above in connection with FIGS. 1 to 8 or one or more examples described above in connection with FIGS. 1 to 8 is illustrated in FIG. 9.

FIG. 9 schematically illustrates an example of a radio base station 940 (e.g. for a femtocell, a picocell, a microcell or a macrocell) comprising an input circuitry 900 for an ADC 901 as proposed. A receiver 950 of the base station 940 comprises the input circuitry 900 receiving a RF receive signal from at least one antenna element 952 of the base station 940. The receiver 950 additionally comprises the ADC 901. The input circuitry 900 may supply the input signal to the ADC 901 based on the RF receive signal. The ADC 901 is coupled to the buffer amplifier of the input circuitry 900 and is configured to generate digital data based on the buffered signal from the buffer amplifier. For example, the input circuitry 900 may be (part of) an analog RF front-end and comprising one or more of a Low-Noise Amplifier (LNA), filter, a down-conversion mixer, Electro Static Discharge (ESD) protection circuitry, an attenuator etc. Further, the base station 940 comprises a transmitter 954 configured to generate a RF transmit signal. The transmitter 954 may use the antenna element 952 or another antenna element (not illustrated) of the base station 940 for radiating the RF transmit signal to the environment.

To this end, a base station with improved analog-to-digital conversion capabilities may be provided.

The base station 940 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit (I2C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Inter-face Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more back-up power sources such as a battery or capacitor. Power alarm detection circuitry may detect one or more of brown out (under-voltage) and surge (over-voltage) conditions.

In some aspects, the power tee circuitry may provide for electrical power drawn from a net work cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Another example of an implementation using neutralization for analog-to digital conversion according to one or more aspects of the input circuitry described above in connection with FIGS. 1 to 9 or one or more examples described above in connection with FIGS. 1 to 9 is illustrated in FIG. 10. FIG. 10 schematically illustrates an example of a mobile device 1060 (e.g. mobile phone, smartphone, tablet-computer, or laptop) comprising an input circuitry 1000 as proposed.

A receiver 1050 of the mobile device 1060 comprises an ADC 1001 and input circuitry 1000 receiving an RF receive signal from at least one antenna element 1052 of the mobile device 1060. The input circuitry 1000 supplies the input signal to the ADC 1001 based on the RF receive signal. The ADC 1001 generates digital data based on the input signal. For example, the input circuitry 1000 may be (part of) an analog RF front-end and comprise one or more of a LNA, a filter, a down-conversion mixer, ESD protection circuitry, an attenuator etc.

Further, the mobile device 1060 comprises a transmitter 1054 configured to generate an RF transmit signal. The transmitter 1054 may use the antenna element 1052 or another antenna element (not illustrated) of the mobile device 1060 for radiating the RF transmit signal to the environment.

To this end, a mobile device with improved analog-to-digital conversion capabilities may be provided.

The mobile device 1060 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I2C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using analog-to-digital conversion according to the proposed technique or one or more of the examples described above may be configured to operate according to one of the 3rd Generation Partnership Project (3GPP)-standardized mobile communication networks or systems. The mobile or wireless communication system may correspond to, for example, a 5th Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UT-RAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Interoperability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

However, it is to be noted that the proposed ADC system may be used not only in receivers for wireless signals. The proposed ADC system may, for example, be used for high precision instrumentation or wireline receivers as well. Therefore, examples of the present disclosure further relate to a receiver comprising an input circuitry as proposed herein and an ADC coupled to the buffer amplifier and configured to generate digital data based on the buffered signal from the buffer amplifier. The input circuitry receives a receive signal from a wired transmission link. The input circuitry supplies the analog input signal to the ADC based on the receive signal. For example, the input circuitry may comprise one or more of a LNA, a filter, a down-conversion mixer, ESD protection circuitry, an attenuator etc. Further, examples relate to any electronic device comprising the proposed ADC system.

For further illustrating the neutralization technique for ADCs as described above, FIG. 11 illustrates a flowchart of a method 1100 for operating an input circuitry for an ADC. The method 1100 comprises outputting 1101 a calibration signal for the ADC by a calibration signal source of the input circuitry. The method 1100 further comprises receiving and processing 1102 an analog input signal for the ADC by analog circuitry of the input circuitry. Processing the analog input signal comprises generating a combined signal by combining the analog input signal and a calibration signal for the ADC. The method 1100 further comprises supplying 1103, by a buffer amplifier of the input circuitry and based on the combined signal, a buffered signal to the ADC. The method 1100 further comprises generating 1104, by neutralization circuitry of the input circuitry and based on the calibration signal, a neutralization signal for mitigating an unwanted signal component related to a limited reverse isolation of the analog circuitry. Further, the method 1100 comprises supplying 1105, by the neutralization circuitry, the neutralization signal to at least one of an input node and an intermediate node of the analog circuitry.

Optionally generating 1104 the neutralization signal comprises generating the neutralization signal by an impedance element of at least one coupling path of the neutralization circuitry and based on the calibration signal using a complex transfer function, the at least one coupling path being coupled between an input node of the neutralization circuitry receiving the calibration signal and an output node of the neutralization circuitry outputting the neutralization signal.

Optionally the method 1100, further comprises selectively decoupling, based on a control signal received from circuitry external to the neutralization circuitry, the impedance element from the input node of the neutralization circuitry or the output node of the neutralization circuitry by a switch circuit of the at least one coupling path.

For example, a transfer function used by the neutralization circuitry to generate the neutralization signal is (e.g. approximately) the negative of a reverse isolation transfer function of the analog circuitry.

The method 1100 may allow to provide a neutralization signal for mitigating unwanted signal components related to a limited reverse isolation of the analog circuitry. Accordingly, negative effects of the analog circuitry's limited reverse isolation on circuitry preceding the input circuitry or the analog circuitry may be avoided.

More details and aspects of the method 1100 are explained in connection with the proposed technique or one or more examples described above (e.g. FIGS. 1 to 10). The method 1100 may comprise one or more additional optional features corresponding to one or more aspects of the proposed technique or one or more examples described above.

The proposed technique may refer to a leakage neutralization of a calibration signal used for ADC background calibration. The proposed input circuitry may provide an extra analog path from the calibration signal source to the input node (or intermediate node) optimized for neutralization of the leaked analog calibration signal at the point of neutralization. For example, the transfer function $T_N(j\omega)$ of the neutralization circuitry is chosen close to the (complex) negative of the reverse (or leakage) isolation transfer function $T_{ISO}(j\omega)$, such that the leaked calibration signal may be cancelled over the frequency range of interest, such as by the approximation: $T_N(j\omega) \approx -T_{ISO}(j\omega)$.

To mitigate the leaked calibration signal, the neutralization signal, may be injected at a point with limited reverse isolation. This may avoid a violation of the spectral emission mask for a particular system affected by the leaked calibration signal. Further, a calibration signal with less spectral spreading can be used, e.g. to simplify the digital processing as well as the generation of the calibration signal. This technique may enable a more comprehensive background calibration of the receiver by including all nonlinear analog blocks in the receiver, and it also may allow a less complexity in the calibration signal generation.

The existence of the calibration signal source and injection path into the analog circuitry, as well as the existence of the analog neutralization path with dedicated connection points into the analog input circuitry may be revealable by e.g. layout inspection followed by schematic analysis.

The examples described herein may be summarized as follows:

An example (e.g. example 1) relates to an input circuitry for an analog-to-digital converter, ADC, the input circuitry comprising: a calibration signal source configured to output a calibration signal for the ADC; analog circuitry configured to receive and process an analog input signal for the ADC, wherein the analog circuitry is further configured to generate a combined signal by combining the analog input signal and the calibration signal; a buffer amplifier coupled to the analog circuitry and configured to supply a buffered signal to the ADC based on the combined signal; and neutralization circuitry configured to: generate, based on the calibration signal, a neutralization signal for mitigating an unwanted signal component related to a limited reverse isolation of the analog circuitry; and supply the neutralization signal to at least one of an input node and an intermediate node of the analog circuitry.

Another example (e.g. example 2) relates to a previously described example (e.g. example 1), wherein the analog circuitry comprises a first sub-circuit and a second sub-circuit. The first sub-circuit is upstream of the second sub-circuit and configured to receive and process the analog input signal. The second sub-circuit is configured to generate the combined signal based on the analog input signal and the calibration signal; and the intermediate node is part of the first sub-circuit.

Another example (e.g. example 3) relates to a previously described example (e.g. one of the examples 1-2), wherein a transfer function used by the neutralization circuitry to generate the neutralization signal is approximately the negative of a reverse isolation transfer function of the analog circuitry.

Another example (e.g. example 4) relates to a previously described example (e.g. one of the examples 1-3), wherein the neutralization circuitry comprises at least one coupling path coupled between an input node of the neutralization circuitry and an output node of the neutralization circuitry. The input node of the neutralization circuitry is configured to receive the calibration signal. The output node of the neutralization circuitry is configured to output the neutralization signal, and the at least one coupling path comprises an impedance element configured to generate the neutralization signal based on the calibration signal using a complex transfer function.

Another example (e.g. example 5) relates to a previously described example (e.g. example 4), wherein the impedance element comprises at least one resistor, at least one capacitor or at least one inductor or a combination thereof.

Another example (e.g. example 6) relates to a previously described example (e.g. one of the examples 4-5), wherein the at least one coupling path comprises a switch circuit configured to selectively decouple, based on a control signal received from circuitry external to the neutralization circuitry, the impedance element from the input node of the neutralization circuitry or the output node of the neutralization circuitry. Optionally the switch circuit may be configured to selectively decouple, based on a control signal received from circuitry external to the neutralization circuitry, the impedance element from the input node of the neutralization circuitry and the output node of the neutralization circuitry.

Another example (e.g. example 7) relates to a previously described example (e.g. one of the examples 4-6), wherein the neutralization circuitry comprises a plurality of coupling paths coupled in parallel between the input node of the neutralization circuitry and the output node of the neutralization circuitry, wherein each of the plurality of coupling paths comprises a respective impedance element configured to generate a respective contribution to the neutralization signal based on the calibration signal using a respective (in general) complex transfer function.

Another example (e.g. example 8) relates to a previously described example (e.g. example 7), further comprising: at least one further coupling path coupled between the input node of the neutralization circuitry and another output node of the neutralization circuitry, wherein the output node of the neutralization circuitry is coupled to the input node of the analog circuitry, wherein the other output node of the neutralization circuitry is coupled to the intermediate node of the analog circuitry, and wherein the at least one further coupling path comprises a further impedance element configured to generate a further neutralization signal based on the calibration signal using a further complex transfer function.

Another example (e.g. example 9) relates to a previously described example (e.g. one of the examples 4-8), wherein the impedance element comprises at least three capacitors each connected to a common node to form a T-network, a first capacitor of the at least three capacitors is coupled between the input node or an intermediate node of the neutralization circuitry and the common node, a second capacitor of the at least three capacitors is coupled between the common node and the output node or another intermediate node of the neutralization circuitry, and a third capacitor of the at least three capacitors is coupled between the common node and a ground node via a switch.

Another example (e.g. example 10) relates to a previously described example (e.g. one of the examples 4-9), wherein the neutralization circuitry comprises at least one other coupling path coupled between another input node of the neutralization circuitry and another output node of the neutralization circuitry, the other input node of the neutralization circuitry is configured to receive another calibration signal from the calibration signal source, the calibration signal and the other calibration signal forming a differential calibration signal pair for the analog-to-digital converter, the other output node of the neutralization circuitry is configured to output another neutralization signal to at least one of another input node and another intermediate node of the analog circuitry, and the at least one other coupling path comprises another impedance element configured to generate the other neutralization signal based on the other calibration signal using another other complex transfer function.

Another example (e.g. example 11) relates to a previously described example (e.g. example 10), wherein the neutralization circuitry further comprises a shunt path coupled between the at least one coupling path and the at least one other coupling path. The shunt path comprises a switch circuit configured to selectively decouple, based on a control signal received from circuitry external to the neutralization circuitry, the at least one coupling path from the at least one other coupling path.

An example (e.g. example 12) relates to a receiver, comprising: input circuitry relating to a previously described example (e.g. one of the examples 1-11); and an analog-to-digital converter, ADC, coupled to the buffer amplifier and configured to generate digital data based on the buffered signal from the buffer amplifier.

Another example (e.g. example 13) relates to a previously described example (e.g. example 12), wherein the analog input signal is a radio frequency signal.

An example (e.g. example 14) relates to a base station, comprising: a receiver relating to a previously described example (e.g. one of the examples 12-13); and a transmitter configured to generate a radio frequency transmit signal.

Another example (e.g. example 15) relates to a previously described example (e.g. example 14), further comprising: at least one antenna element coupled to at least one of the receiver and the transmitter.

An example (e.g. example 16) relates to a mobile device, comprising: a receiver relating to a previously described example (e.g. one of the examples 12-13); and a transmitter configured to generate a radio frequency transmit signal.

Another example (e.g. example 17) relates to a previously described example (e.g. example 16), further comprising: at least one antenna element coupled to at least one of the receiver and the transmitter.

An example (e.g. example 18) relates to a method for operating an input circuitry for an analog-to-digital converter, ADC, the method comprising: outputting a calibration signal for the ADC by a calibration signal source of the input circuitry; receiving and processing an analog input signal for the ADC by analog circuitry of the input circuitry, wherein processing the analog input signal comprises generating a combined signal by combining the analog input signal and a calibration signal for the ADC; supplying, by a buffer amplifier of the input circuitry and based on the combined signal, a buffered signal to the ADC; generating, by neutralization circuitry of the input circuitry and based on the calibration signal, a neutralization signal for mitigating an unwanted signal component related to a limited reverse isolation of the analog circuitry; and supplying, by the neutralization circuitry, the neutralization signal to at least one of an input node and an intermediate node of the analog circuitry.

Another example (e.g. example 19) relates to a previously described example (e.g. example 18), wherein generating the neutralization signal comprises: generating the neutralization signal by an impedance element of at least one coupling path of the neutralization circuitry and based on the calibration signal using a complex transfer function, the at least one coupling path being coupled between an input node of the neutralization circuitry receiving the calibration signal and an output node of the neutralization circuitry outputting the neutralization signal.

Another example (e.g. example 20) relates to a previously described example (e.g. example 19), further comprising: selectively decoupling, based on a control signal received from circuitry external to the neutralization circuitry, the impedance element from the input node of the neutralization circuitry or the output node of the neutralization circuitry by a switch circuit of the at least one coupling path.

Another example (e.g. example 21) relates to a previously described example (e.g. one of the examples 18-20), wherein a transfer function used by the neutralization circuitry to generate the neutralization signal is approximately the negative of a reverse isolation transfer function of the analog circuitry.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. Input circuitry for an analog-to-digital converter, ADC, the input circuitry comprising:
    a calibration signal source configured to output a calibration signal for the ADC;
    analog circuitry configured to receive and process an analog input signal for the ADC, wherein the analog circuitry is further configured to generate a combined signal by combining the analog input signal and the calibration signal;
    a buffer amplifier coupled to the analog circuitry and configured to supply a buffered signal to the ADC based on the combined signal; and
    neutralization circuitry configured to:
    generate, based on the calibration signal, a neutralization signal for mitigating an unwanted signal component related to a limited reverse isolation of the analog circuitry; and
    supply the neutralization signal to at least one of an input node and an intermediate node of the analog circuitry.

2. The input circuitry according to claim 1, wherein
    the analog circuitry comprises a first sub-circuit and a second sub-circuit,
    the first sub-circuit is upstream of the second sub-circuit and configured to receive and process the analog input signal,
    the second sub-circuit is configured to generate the combined signal based on the analog input signal and the calibration signal; and
    the intermediate node is part of the first sub-circuit.

3. The input circuitry according to claim 1, wherein
    a transfer function used by the neutralization circuitry to generate the neutralization signal is approximately the negative of a reverse isolation transfer function of the analog circuitry.

4. The input circuitry according to claim 1, wherein
    the neutralization circuitry comprises at least one coupling path coupled between an input node of the neutralization circuitry and an output node of the neutralization circuitry,
    the input node of the neutralization circuitry is configured to receive the calibration signal,
    the output node of the neutralization circuitry is configured to output the neutralization signal, and
    the at least one coupling path comprises an impedance element configured to generate the neutralization signal based on the calibration signal using a complex transfer function.

5. The input circuitry according to claim 4, wherein
    the impedance element comprises at least one resistor, at least one capacitor or at least one inductor or a combination thereof.

6. The input circuitry according to claim 4, wherein
    the at least one coupling path comprises a switch circuit configured to selectively decouple, based on a control signal received from circuitry external to the neutralization circuitry, the impedance element from the input node of the neutralization circuitry or the output node of the neutralization circuitry.

7. The input circuitry according to claim 4, wherein
    the neutralization circuitry comprises a plurality of coupling paths coupled in parallel between the input node of the neutralization circuitry and the output node of the neutralization circuitry, wherein each of the plurality of coupling paths comprises a respective impedance element configured to generate a respective contribution to the neutralization signal based on the calibration signal using a respective complex transfer function.

8. The input circuitry according to claim 7, further comprising:
at least one further coupling path coupled between the input node of the neutralization circuitry and another output node of the neutralization circuitry,
wherein the output node of the neutralization circuitry is coupled to the input node of the analog circuitry,
wherein the other output node of the neutralization circuitry is coupled to the intermediate node of the analog circuitry, and
wherein the at least one further coupling path comprises a further impedance element configured to generate a further neutralization signal based on the calibration signal using a further complex transfer function.

9. The input circuitry according to claim 4, wherein
the impedance element comprises at least three capacitors each connected to a common node to form a T-network, a first capacitor of the at least three capacitors is coupled between the input node or an intermediate node of the neutralization circuitry and the common node, a second capacitor of the at least three capacitors is coupled between the common node and the output node or another intermediate node of the neutralization circuitry, and a third capacitor of the at least three capacitors is coupled between the common node and a ground node via a switch.

10. The input circuitry according to claim 4, wherein
the neutralization circuitry comprises at least one other coupling path coupled between another input node of the neutralization circuitry and another output node of the neutralization circuitry,
the other input node of the neutralization circuitry is configured to receive another calibration signal from the calibration signal source, the calibration signal and the other calibration signal forming a differential calibration signal pair for the analog-to-digital converter,
the other output node of the neutralization circuitry is configured to output another neutralization signal to at least one of another input node and another intermediate node of the analog circuitry, and
the at least one other coupling path comprises another impedance element configured to generate the other neutralization signal based on the other calibration signal using another other complex transfer function.

11. The input circuitry according to claim 10, wherein
the neutralization circuitry further comprises a shunt path coupled between the at least one coupling path and the at least one other coupling path, the shunt path comprises a switch circuit configured to selectively decouple, based on a control signal received from circuitry external to the neutralization circuitry, the at least one coupling path from the at least one other coupling path.

12. A receiver, comprising:
input circuitry according to claim 1; and
an analog-to-digital converter, ADC, coupled to the buffer amplifier and configured to generate digital data based on the buffered signal from the buffer amplifier.

13. The receiver according to claim 12, wherein
the analog input signal is a radio frequency signal.

14. A base station, comprising:
a receiver according to claim 12; and
a transmitter configured to generate a radio frequency transmit signal.

15. The base station according to claim 14, further comprising:
at least one antenna element coupled to at least one of the receiver and the transmitter.

16. A method for operating an input circuitry for an analog-to-digital converter, ADC, the method comprising:
outputting a calibration signal for the ADC by a calibration signal source of the input circuitry;
receiving and processing an analog input signal for the ADC by analog circuitry of the input circuitry, wherein processing the analog input signal comprises generating a combined signal by combining the analog input signal and a calibration signal for the ADC;
supplying, by a buffer amplifier of the input circuitry and based on the combined signal, a buffered signal to the ADC;
generating, by neutralization circuitry of the input circuitry and based on the calibration signal, a neutralization signal for mitigating an unwanted signal component related to a limited reverse isolation of the analog circuitry; and
supplying, by the neutralization circuitry, the neutralization signal to at least one of an input node and an intermediate node of the analog circuitry.

17. The method according to claim 16, wherein generating the neutralization signal comprises:
generating the neutralization signal by an impedance element of at least one coupling path of the neutralization circuitry and based on the calibration signal using a complex transfer function, the at least one coupling path being coupled between an input node of the neutralization circuitry receiving the calibration signal and an output node of the neutralization circuitry outputting the neutralization signal.

18. The method according to claim 17, further comprising:
selectively decoupling, based on a control signal received from circuitry external to the neutralization circuitry, the impedance element from the input node of the neutralization circuitry or the output node of the neutralization circuitry by a switch circuit of the at least one coupling path.

19. The method according to claim 16, wherein
a transfer function used by the neutralization circuitry to generate the neutralization signal is approximately the negative of a reverse isolation transfer function of the analog circuitry.

* * * * *